United States Patent
Park et al.

(10) Patent No.: US 9,368,465 B2
(45) Date of Patent: Jun. 14, 2016

(54) METHOD OF FORMING BUMP PAD STRUCTURE HAVING BUFFER PATTERN

(71) Applicant: Samsung Electronics Co., Ltd., Suwon-Si, Gyeonggi-Do (KR)

(72) Inventors: Soo-Jae Park, Seongnam-si (KR); Hyun-Suk Chun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/514,704

(22) Filed: Oct. 15, 2014

(65) Prior Publication Data

US 2015/0235974 A1    Aug. 20, 2015

(30) Foreign Application Priority Data

Feb. 20, 2014  (KR) .......................... 10-2014-0019893

(51) Int. Cl.
H01L 21/00      (2006.01)
H01L 23/00      (2006.01)
H01L 21/768     (2006.01)

(52) U.S. Cl.
CPC .......... *H01L 24/11* (2013.01); *H01L 21/76841* (2013.01); *H01L 21/76877* (2013.01); *H01L 21/76895* (2013.01); *H01L 2224/11831* (2013.01); *H01L 2224/11916* (2013.01); *H01L 2224/13024* (2013.01); *H01L 2224/13147* (2013.01); *H01L 2924/07025* (2013.01); *H01L 2924/3512* (2013.01)

(58) Field of Classification Search
CPC ..................... H01L 21/02164; H01L 21/0217; H01L 21/76841; H01L 21/76877; H01L 21/76895; H01L 24/11; H01L 24/07025; H01L 2924/3512
See application file for complete search history.

(56) References Cited

U.S. PATENT DOCUMENTS

| | | | |
|---|---|---|---|
| 7,812,438 B2 | 10/2010 | Jadhav et al. | |
| 2009/0283877 A1* | 11/2009 | Tsai | H01L 24/11 257/659 |
| 2010/0237491 A1 | 9/2010 | Park et al. | |
| 2012/0018875 A1 | 1/2012 | Yang et al. | |

FOREIGN PATENT DOCUMENTS

KR    10-1185455 B1    10/2012

OTHER PUBLICATIONS

E. Misra, "Novel Design and Integration Enhancements in the Final Polymeric Passivation for Improved Mechanical Performance and C4 Electromigration in Lead-Free C4 Products", published in Electronic Components and Technology Conference (ECTC), 2012 IEEE 62nd, 2012, 6pgs, NY and AZ.

\* cited by examiner

*Primary Examiner* — Whitney T Moore
*Assistant Examiner* — Joseph Galvin, III
(74) *Attorney, Agent, or Firm* — Harness, Dickey & Pierce, P.L.C.

(57) ABSTRACT

The method includes forming an upper layer on a lower layer, forming a metal interconnection in the upper layer, forming a passivation layer exposing a center part of the metal interconnection on the upper layer, forming a buffer pattern exposing the center part of the metal interconnection, and selectively and asymmetrically covering a peripheral region of the metal interconnect and a part of the passivation layer, forming a wrapping pattern covering the buffer pattern and exposing the center part of the metal interconnection on the passivation layer, and forming a pad pattern on the center part of the metal interconnection.

20 Claims, 28 Drawing Sheets

METHOD OF FORMING BUMP PAD STRUCTURE HAVING BUFFER PATTERN

CROSS-REFERENCE TO RELATED APPLICATION

This application claims priority under 35 U.S.C. §119 to Korean Patent Application No. 10-2014-0019893 filed on Feb. 20, 2014, the disclosure of which is hereby incorporated by reference in its entirety.

BACKGROUND

1. Field

Embodiments of the inventive concepts relate to bump pad structures or bump structures and/or a method of forming the same, semiconductor devices including the bump pad structures or the bump structures and/or a method of fabricating the same, and/or electronic systems including the semiconductor devices.

2. Description of Related Art

As semiconductor devices are highly integrated, semiconductor devices have a greater number of input/output pins are necessary, and accordingly sizes of bump structures and bump pad structures are becoming smaller.

Recently, semiconductor packaging technology using flip-chip bonding is becoming widespread. The flip-chip bonding technique includes a process of releasing and heating a solder ball, etc. disposed between a semiconductor device and a printed circuit board (PCB) to reflow the solder ball. In this process, due to a difference in thermal expansion coefficient between the semiconductor device and the PCB, a physical stress may be applied to a bump structure of the semiconductor device. The stress may cause cracks particularly in an insulating layer.

SUMMARY

Some embodiments of the inventive concepts provide a bump pad structure or bump structure including a buffer pattern.

Some embodiments of the inventive concepts provide a semiconductor device including a bump pad structure or bump structure including a buffer pattern.

Still other embodiments of the inventive concepts provide an electronic system including a semiconductor device including a bump pad structure or bump structure including a buffer pattern.

Still other embodiments of the inventive concepts provide a method of forming a bump pad structure or bump structure including a buffer pattern.

Still other embodiments of the inventive concepts provide a method of fabricating a semiconductor device including a bump pad structure or bump structure including a buffer pattern.

The technical objectives of the inventive concepts are not limited to the above disclosure; other objectives may become apparent to those of ordinary skill in the art based on the following descriptions.

In accordance with an aspect of the inventive concepts, a method of forming a bump pad structure includes forming an upper layer on a lower layer, forming a metal interconnection in the upper layer, forming a passivation layer exposing a center part of the metal interconnection on the upper layer, forming a buffer pattern exposing the center part of the metal interconnection and selectively and asymmetrically covering a peripheral region of the metal interconnect and a part of the passivation layer, forming a wrapping pattern covering the buffer pattern and exposing the center part of the metal interconnection and the passivation layer, and forming a pad pattern on the center part of the metal interconnection.

In accordance with an aspect of the inventive concepts, a method of forming a bump pad structure includes forming an upper layer on a lower layer, forming a metal interconnection buried in the upper layer, forming a passivation layer exposing a center part of the metal interconnection on the upper layer, forming a buffer pattern vertically overlapping a part of the metal interconnection and a part of the passivation layer on the metal interconnection, forming a wrapping pattern exposing the center part of the metal interconnection and covering the buffer pattern on the passivation layer, and forming a pad pattern on the exposed center part of the metal interconnection and on a sidewall of the wrapping pattern adjacent to the exposed center part of the metal interconnection. The buffer pattern has a half-donut shape in a top view.

In accordance with another aspect of the inventive concepts, a method of forming a bump structure includes forming a passivation layer exposing a center part of a metal interconnection such that a first section of the passivation layer is formed on a peripheral portion of the metal interconnection; forming a buffer pattern on less than an entirety of the first section of passivation layer such that the center part of the metal interconnection remains exposed; forming a wrapping pattern on the buffer pattern such that the center part of the metal interconnection remains exposed; and forming a pad pattern on the center part of the metal interconnection.

Details of other embodiments are included in the detailed description and drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1A:
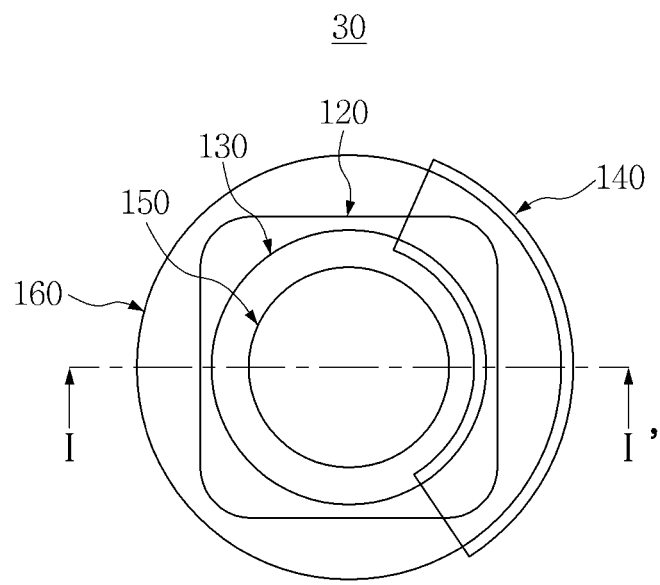
FIG. 1A is a layout showing a bump pad structure of a semiconductor device in accordance with an embodiment of the inventive concepts.

Various embodiments will now be described more fully with reference to the accompanying drawings in which some embodiments are shown. However, since the invention is not limited to the embodiments disclosed hereinafter, the embodiments of the invention should be implemented in various forms. The embodiments of the invention are only provided for complete disclosure and to fully show the scope of the invention to those skilled in the art, and only defined by the scope of the appended claims.

The terminology used herein to describe embodiments is not intended to limit the scope of the invention. The use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "connected to" or "coupled to" another element or layer, it can be connected or coupled to the other element or layer or intervening elements or layers may be present. In contrast, when an element is referred to as "directly connected to" or "directly coupled to" another element or layer, there are no intervening elements or layers present. The term "and/or" includes any and all combinations of one or more referents.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to a cross-sectional view, a plan view, and/or a block diagram that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an etched region illustrated as a rectangle will, typically, have features that are rounded or have a predetermined curvature. Thus, the regions illustrated in the figures are schematic in nature and their shapes are not intended to illustrate the actual shape of a region of a device and are not intended to limit the scope of the present inventive concepts.

The same reference numerals denote the same elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

Figure 1B:
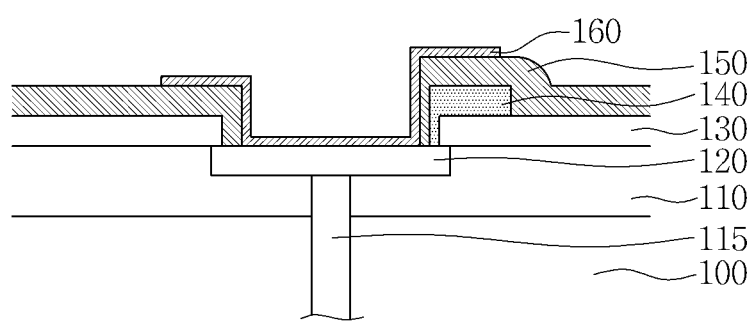
FIG. 1B is a vertical cross-sectional view showing a bump pad structure of a semiconductor device taken along line I-I' of FIG. 1A in accordance with an embodiment of the inventive concepts.

FIG. 1A is a layout showing a bump pad structure 30 of a semiconductor device in accordance with an embodiment of the inventive concepts, and FIG. 1B is a vertical cross-sectional view showing a bump pad structure 30a of a semiconductor device, which is taken along line I-I' of FIG. 1A, in accordance with an embodiment of the inventive concepts.

Referring to FIGS. 1A and 1B, bump pad structures 30 and 30A of the semiconductor device in accordance with an embodiment of the inventive concepts may include an upper layer 110, a metal interconnection 120, a passivation layer 130, a buffer pattern 140, a wrapping pattern 150, and a pad pattern 160, which are disposed on a lower layer 100. The bump pad structures 30 and 30A may further include a via plug 115 vertically passing through the lower layer 100 and the upper layer 110 and electrically connected to the metal interconnection 120. For easier understanding of the inventive concepts, the lower layer 100, the upper layer 110, and the via plug 115 are omitted in FIG. 1A. In addition, only inner ending lines of the passivation layer 130 and the wrapping pattern 150 are illustrated while outer ending lines of the passivation layer 130 and the wrapping pattern 150 are omitted in the layout of FIG. 1A The lower layer 100 may include silicon or silicon oxide. For example, the lower layer 100 may include one of a silicon substrate, a lower inter-layer dielectric layer and a lower inter-metal dielectric layer. The lower layer 100 may include a semiconductor circuit including a MOS transistor, or an I/O circuit there inside or thereunder.

The upper layer 110 may include an insulating material, such as silicon oxide, silicon nitride, or a combination thereof. The upper layer 110 may include one of an upper inter-layer dielectric layer and an upper inter-metal dielectric layer. For example, the upper layer 110 may include a silicon nitride layer directly formed on the lower layer 100, and a silicon oxide layer formed on the silicon nitride layer. In other embodiments, the upper layer 110 may include two or more silicon oxide layers.

The metal interconnection 120 may be disposed on the upper layer 110. For example, the metal interconnection 120 may be disposed on the upper layer 110 to be buried in the upper layer 110. A surface of the metal interconnection 120 may be co-planar with a surface of the upper layer 110. The metal interconnection 120 may have a circular or a polygonal shape in a top view. The metal interconnection 120 may include a metal, such as copper (Cu), aluminum (Al), or tungsten (W). The metal interconnection 120 may include the uppermost metal layer of a semiconductor device 10. In other embodiments, the metal interconnection 120 may have the shape of a horizontally extending line.

The via plug 115 may vertically pass through the upper layer 110 and the lower layer 100 so as to be vertically aligned with the metal interconnection 120. The via plug 115 may be in direct contact with and electrically connected to the metal interconnection 120. The via plug 115 may include a metal such as copper (Cu). The via plug 115 may be electrically connected to the semiconductor circuit or the I/O circuit disposed inside or under the lower layer 100. In other embodiments, the via plug 115 may include a through-silicon-via (TSV) fully passing through the lower layer 100. The via plug 115 may further include a conductive barrier layer including a metal, and an insulating liner layer including silicon oxide, which are formed on a side surface of the via plug 115.

The passivation layer 130 may be disposed on the entire upper layer 110. The passivation layer 130 may expose a center part of the metal interconnection 120, and partially cover an outer part of the metal interconnection 120. Namely, a first section of the passivation layer 130 is disposed on a peripheral part of the metal interconnection 120, and a remaining, second section of the passivation layer 130 is disposed on the upper layer 110. The passivation layer 130 may include an insulating material, such as silicon nitride which is harder than silicon oxide in order to protect the upper layer 110 and the metal interconnection 120.

The buffer pattern 140 may be disposed directly on a part of the passivation layer 130. The buffer pattern 140 may be partially disposed around the metal interconnection 120. For example, in a vertical cross-sectional view, the buffer pattern 140 may be asymmetrically disposed with the metal interconnection 120 as a center point or a center line on the passivation layer 130. Namely, the buffer pattern 140 is on less than an entirety of the first section of the passivation layer 130. The buffer pattern 140 may partially cover an exposed surface of the metal interconnection 120. The outermost end of the buffer pattern 140 may be located further away from the center of the metal interconnection 120 than the outermost end of the metal interconnection 120. For example, in a top view, an outer side surface of the metal interconnection 120 may be covered by the buffer pattern 140. The buffer pattern 140 may include a polyimide. More specifically, the buffer pattern 140 may include a photo-sensitive polyimide. The buffer pattern 140 may asymmetrically disperse and release a physical stress applied on the metal interconnection 120, the passivation layer 130, the wrapping pattern 150, and/or the pad pattern 160. The buffer pattern 140 may absorb a stress applied on the upper layer 110, the metal interconnection 120, and the passivation layer 130. In particular, the buffer pattern 140 may absorb a shearing stress. Accordingly, inner ends of the buffer pattern 140 may be located more inward than inner ends of the passivation layer 130, and outer ends of the buffer pattern 140 may be located more outward than outer ends of the metal interconnection 120 and the pad pattern 160. As shown in FIG. 1A, when viewed top down, the buffer pattern 140 bay be an annular segment or donut shaped segment.

The wrapping pattern 150 may be directly disposed on the passivation layer 130 to cover the buffer pattern 140. The wrapping pattern 150 may partially cover the outer part of the metal interconnection 120 to partially expose the center part of the metal interconnection 120. The wrapping pattern 150 may include a polyimide. More specifically, the wrapping pattern 150 may include a photo-sensitive polyimide. The wrapping pattern 150 may have a smooth surface at a stepped portion between the buffer pattern 140 and the passivation layer 130. Since the wrapping pattern 150 has a smooth surface, a stress applied on the bump pad structure 30 and 30A is not concentrated on a specific point, but widely released. Since the wrapping pattern 150 is disposed on the buffer pattern 140, physical adhesion of the buffer pattern 140 may be improved. For example, lift-up, peel-off, and separation of the buffer pattern 140 due to a physical stress can be prevented.

The pad pattern 160 may be disposed on the exposed center part of the metal interconnection 120. The pad pattern 160 may be directly formed on a sidewall of the wrapping pattern 150 which exposes the exposed center part of the metal interconnection 120. The pad pattern 160 may be partially formed on an upper surface of the wrapping pattern 150. In other embodiments, the pad pattern 160 may include an under bump metallurgy (UBM) layer or a metal redistribution interconnection layer horizontally extending on the wrapping pattern 150. For example, the pad pattern 160 may include a lower pad pattern and an upper pad pattern 162. The lower pad pattern may include a barrier metal, such as titanium (Ti), titanium nitride (TiN), tantalum (Ta), tantalum nitride (TaN), tungsten (W), or tungsten nitride (WN). The upper pad pattern may include a seed metal such as copper (Cu) and/or a capping metal such as nickel (Ni).

Figure 1C:
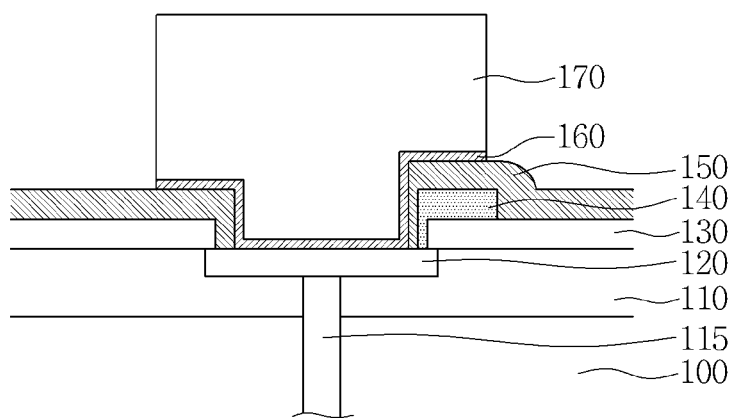
FIGS. 1C and 1D are vertical cross-sectional views showing bump pad structures taken along line I-Ictional view in accordance with embodiments of the inventive concepts.
Figure 1D:
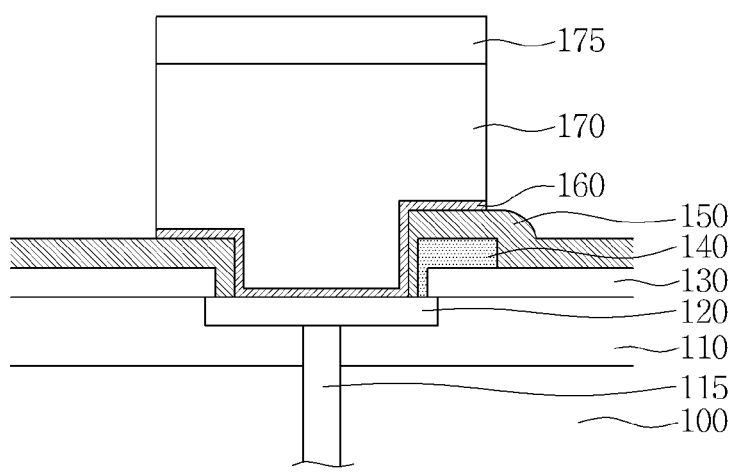

FIGS. 1C and 1D are vertical cross-sectional views showing bump pad structures 30B and 30C in accordance with an embodiment of the inventive concepts, which are taken along line I-I embodiment o Duplicated descriptions of the same components with reference to FIGS. 1A and 1B will be omitted.

Referring to FIG. 1C, a bump pad structure 30B in accordance with an embodiment of the inventive concepts may further include a metal pillar 170 disposed on the pad pattern 160. The metal pillar 170 may be directly disposed on the pad pattern 160. The metal pillar 170 may be a pillar type and/or a mesa type. The metal pillar 170 may have a polygonal or circular shape in a top view. The metal pillar 170 may include copper.

Referring to FIG. 1D, a bump pad structure 30C in accordance with an embodiment of the inventive concepts may further include a capping metal layer 175 disposed on an upper surface of the metal pillar 170. The capping metal layer 175 may include an anti-oxidizing metal, such as Ni or Ag.

Figure 1E:
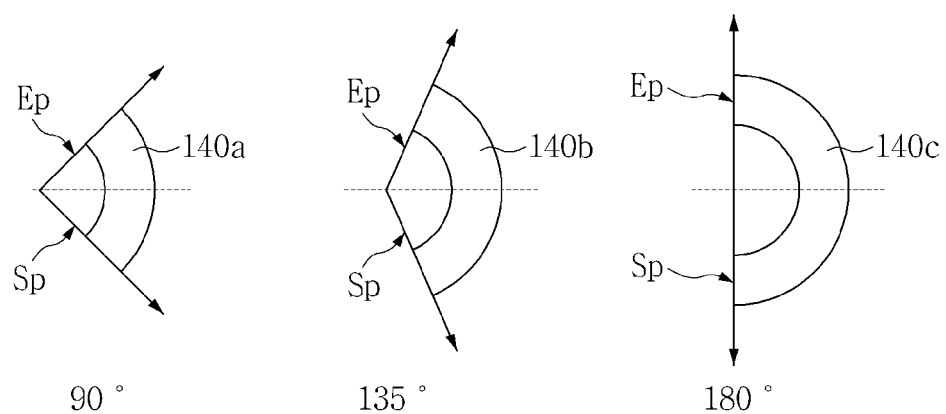
FIG. 1E shows top views of buffer patterns in accordance with an embodiment of the inventive concepts.

FIG. 1E shows top views of the buffer patterns 140a, 140b, and 140c in accordance with embodiments of the inventive concepts. Starting points SP and ending points EP of the buffer patterns 140a, 140b, and 140c may form an angle in the range of about 90° to 180°. The various embodiments of the inventive concepts are illustrated assuming that the angle formed by the starting points SP and the ending points EP of the buffer pattern 140 is about 135°. Since the buffer patterns 140a, 140b, and 140c are required to absorb and disperse a stress applied to the pad pattern 160, it is not desirable for the buffer patterns 140a, 140b, and 140c to be excessively large or small. Empirical study has shown that when the buffer patterns 140a, 140b, and 140c have a quarter-donut to half-donut shape, the stress can be most effectively absorbed and dispersed.

Figure 2A:
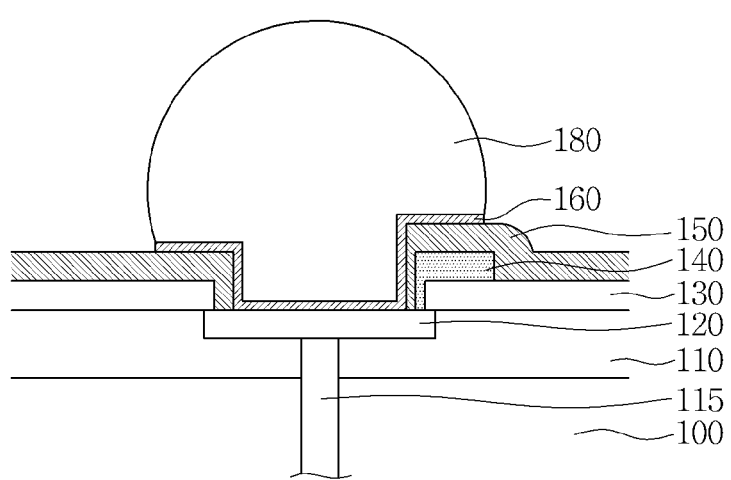
FIGS. 2A to 2C are vertical cross-sectional views schematically illustrating bump structures of a semiconductor device in accordance with various embodiments of the inventive concepts.
Figure 2B:
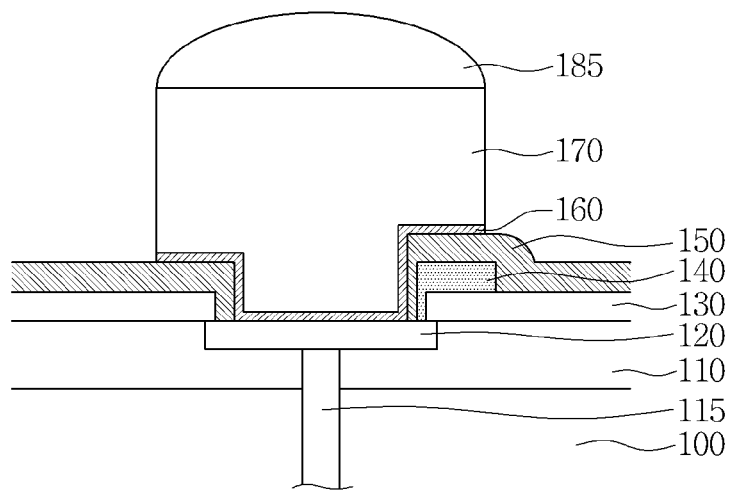
Figure 2C:
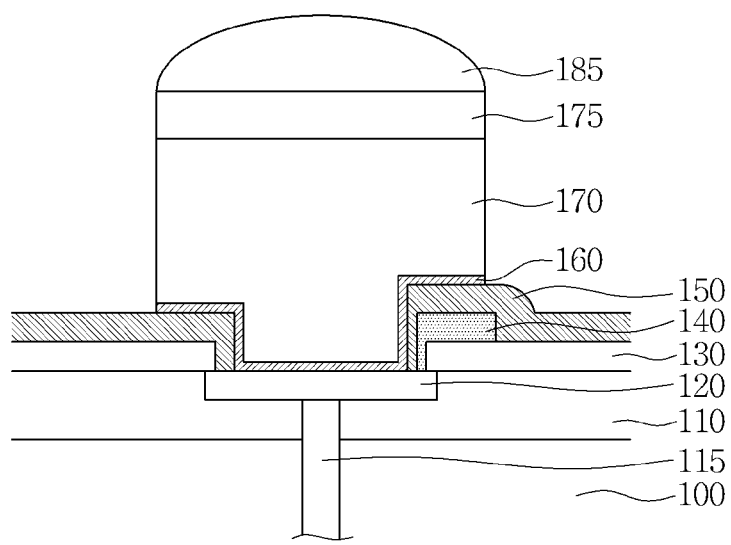

FIGS. 2A to 2C are vertical cross-sectional views schematically illustrating bump structures 40A, 40B, and 40C of a semiconductor device in accordance with various embodiments of the inventive concepts. Duplicated descriptions of the same components with reference to FIGS. 1B to 1D will be omitted.

Referring to FIG. 2A, a bump structure 40A of a semiconductor device in accordance with an embodiment of the inventive concepts may include the bump pad structure 30A illustrated in FIG. 1B, and a solder ball 180 disposed on the pad pattern 160 of the bump pad structure 30A.

Referring to FIG. 2B, a bump structure 40B of a semiconductor device in accordance with an embodiment of the inventive concepts may include the bump pad structure 30B illustrated in FIG. 1C, and a solder bump 185 disposed on the metal pillar 170 of the bump pad structure 30B.

Referring to FIG. 2C, a bump structure 40C of a semiconductor device in accordance with an embodiment of the inventive concepts may include the bump pad structure 30C illustrated in FIG. 1D, and a solder bump 185 disposed on the capping metal layer 175 of the bump pad structure 30C.

Figure 3:
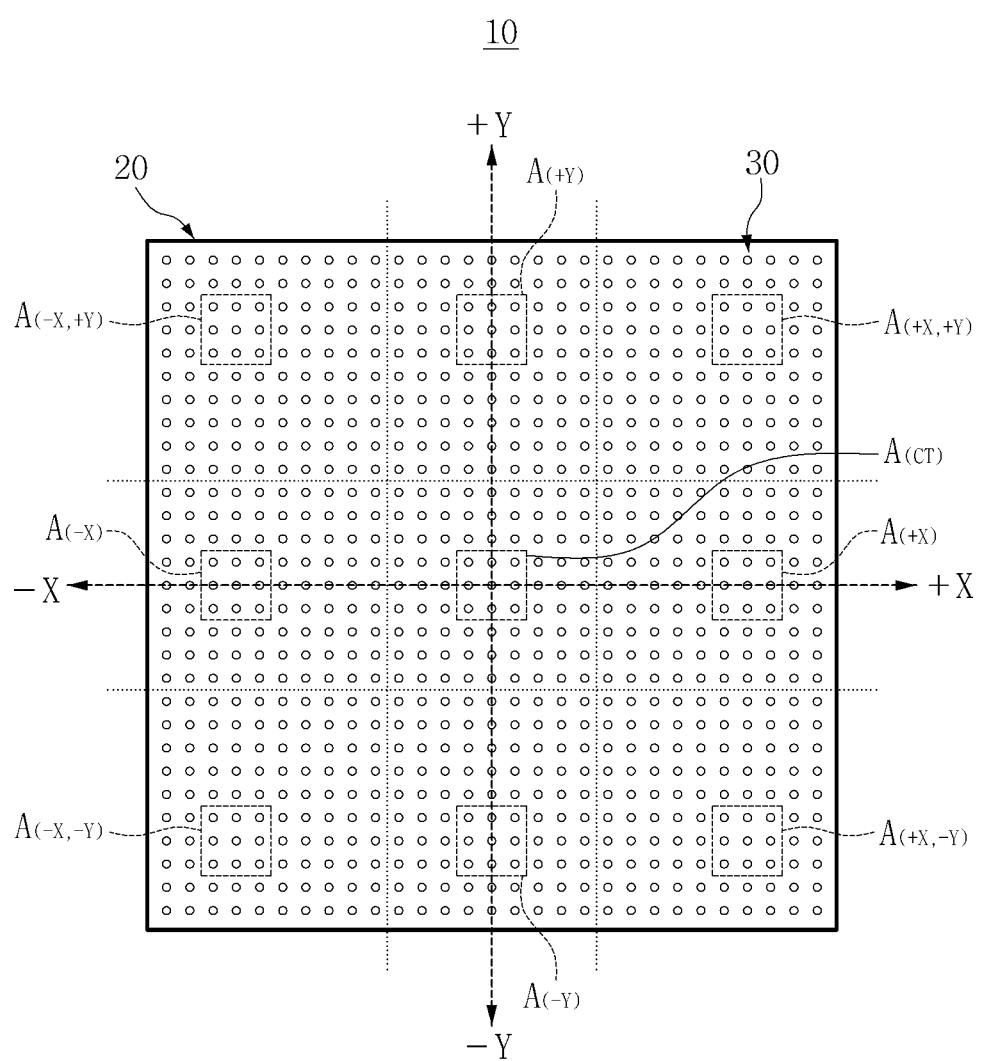
FIG. 3 shows an active surface having an arrangement of bump pad structures of a semiconductor device in accordance with an embodiment of the inventive concepts.
Figure 4A:
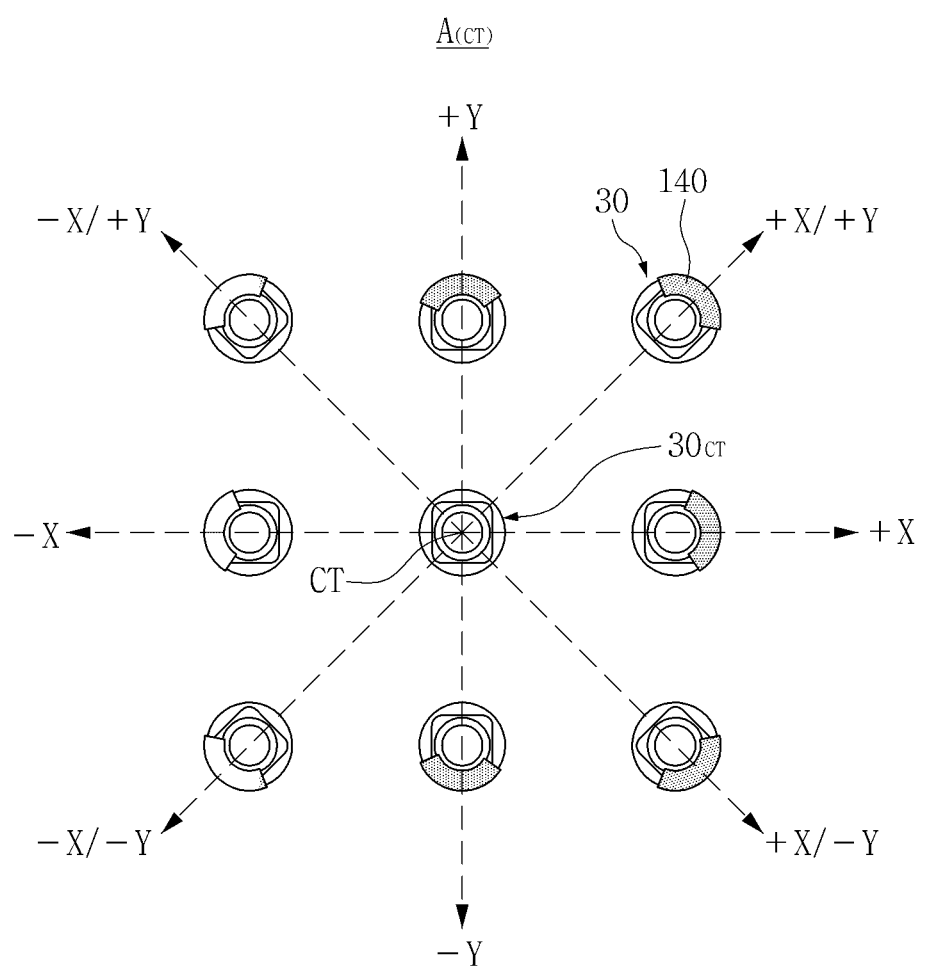
FIG. 4A is an enlarged view showing the arrangement of the bump pad structures in a center area of FIG. 3, and FIGS. 4B to 4I are enlarged views showing bump pad structures arranged in each area of FIG. 3.

FIG. 3 shows an active surface 20 having an arrangement of bump pad structures 30 of a semiconductor device in accordance with an embodiment of the inventive concepts. FIG. 4A is an enlarged view of a center area $A_{(CT)}$ having the arrangement of the bump pad structures 30 in FIG. 3, and FIGS. 4B to 4H are enlarged views showing the bump pad structures 30 arranged in each area $A_{(CT)}$, $A_{(+X)}$, $A_{(-X)}$, $A_{(+Y)}$, $A_{(-Y)}$, $A_{(+X,+Y)}$, $A_{(+X,-Y)}$, $A_{(-X,+Y)}$, and $A_{(-X,-Y)}$ of FIG. 3, respectively.

Referring to FIG. 3, a semiconductor device 10 in accordance with an embodiment of the inventive concepts may include a plurality of bump pad structures 30 arranged in the shape of islands in a grid on the active surface 20. The active surface 20 is a surface on which the bump pad structures 30 are arranged, among a plurality of surfaces of the semiconductor device 10. For easier understanding of the inventive concepts, the embodiment is described assuming that the active surface 20 of the semiconductor device 10 has a square shape, and the bump pad structures 30 have circular shapes.

Referring to FIG. 4A, the bump pad structures 30 arranged in the center area $A_{(CT)}$ may be arranged radially from the center CT of the active surface 20. The "radial arrangement ad means that the buffer pattern 140 is located at an outer side of the center CT of the active surface 20 so as to opposite the center CT. More specifically, the bump pad structures 30 arranged in the +X direction from the center CT may include the buffer patterns 140 located in the +X direction, and the bump pad structures 30 arranged in the −X direction from the center CT may include the buffer patterns 140 located in the −X direction. The bump pad structures 30 arranged in the +Y direction from the center CT may include the buffer patterns 140 located in the +Y direction, and the bump pad structures 30 arranged in the −Y direction from the center CT may include the buffer patterns 140 located in the −Y direction. In addition, the bump pad structures 30 arranged in the +X/+Y direction from the center CT may include the buffer patterns 140 located in the +X/+Y direction, and the bump pad structures 30 arranged in the +X/−Y direction from the center CT may include the buffer patterns 140 located in the +X/−Y direction. The bump pad structures 30 arranged in the −X/+Y direction from the center CT may include the buffer patterns 140 located in the −X/+Y direction, and the bump pad structures 30 arranged in the −X/−Y direction from the center CT may include the buffer patterns 140 located in the −X/−Y direction. Further, bump pad structure $30_{CT}$ located in the center CT of the active surface 20 may not have the buffer pattern 140.

Figure 4B:
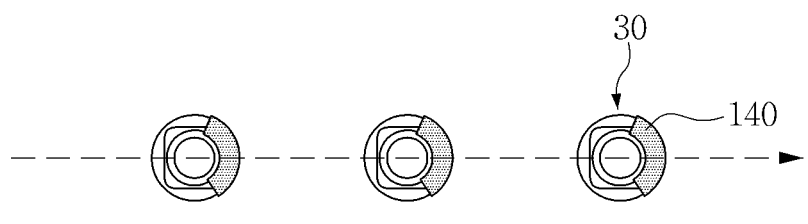
Figure 4B:
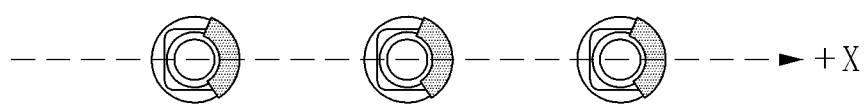
Figure 4B:
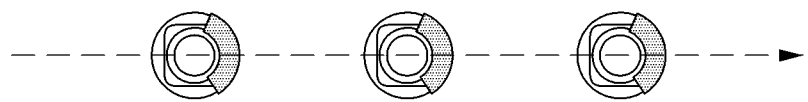

Referring to FIG. 4B, the bump pad structures 30 arranged in the area $A_{(+X)}$ in the +X direction may include the buffer patterns 140 located in the +X direction.

Figure 4C:
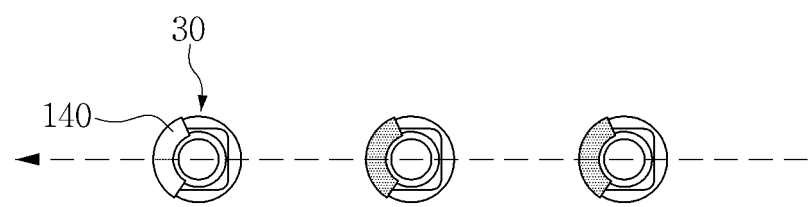
Figure 4C:
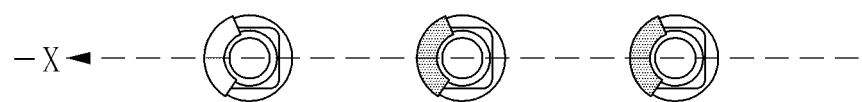
Figure 4C:
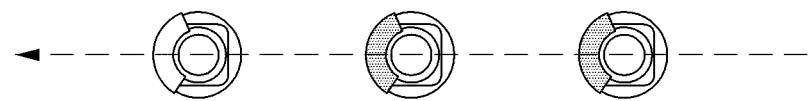

Referring to FIG. 4C, the bump pad structures 30 arranged in the area $A_{(-X)}$ in the −X direction may include the buffer patterns 140 located in the −X direction.

Figure 4D:
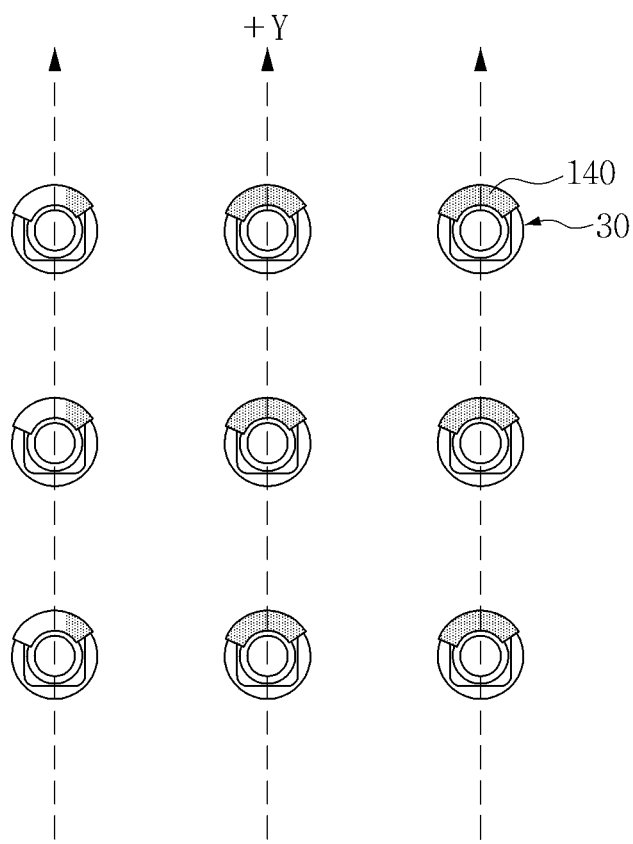

Referring to FIG. 4D, the bump pad structures 30 arranged in the area $A_{(+Y)}$ in the +Y direction may include the buffer patterns 140 located in the +Y direction.

Figure 4E:
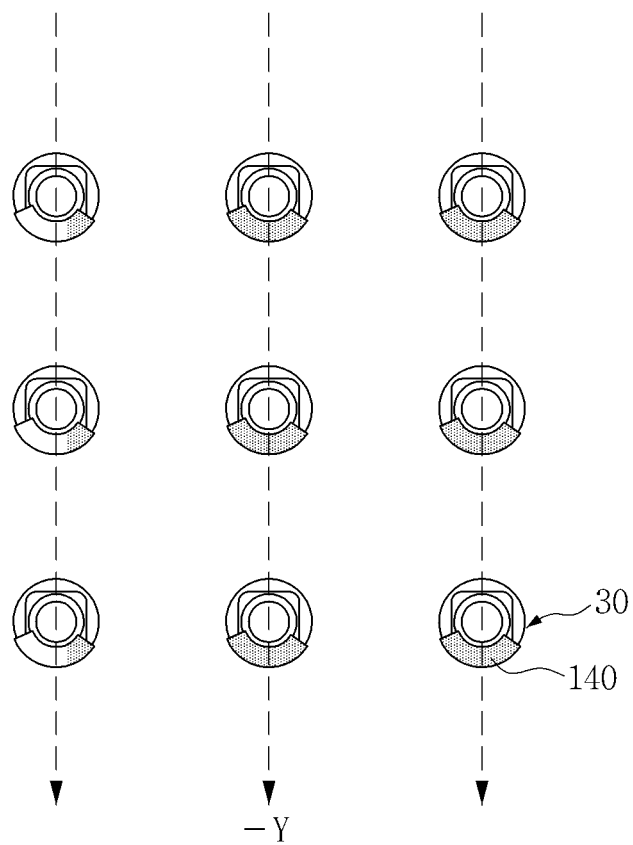

Referring to FIG. 4E, the bump pad structures 30 arranged in the area $A_{(-Y)}$ in the −Y direction may include the buffer patterns 140 located in the −Y direction.

Figure 4F:
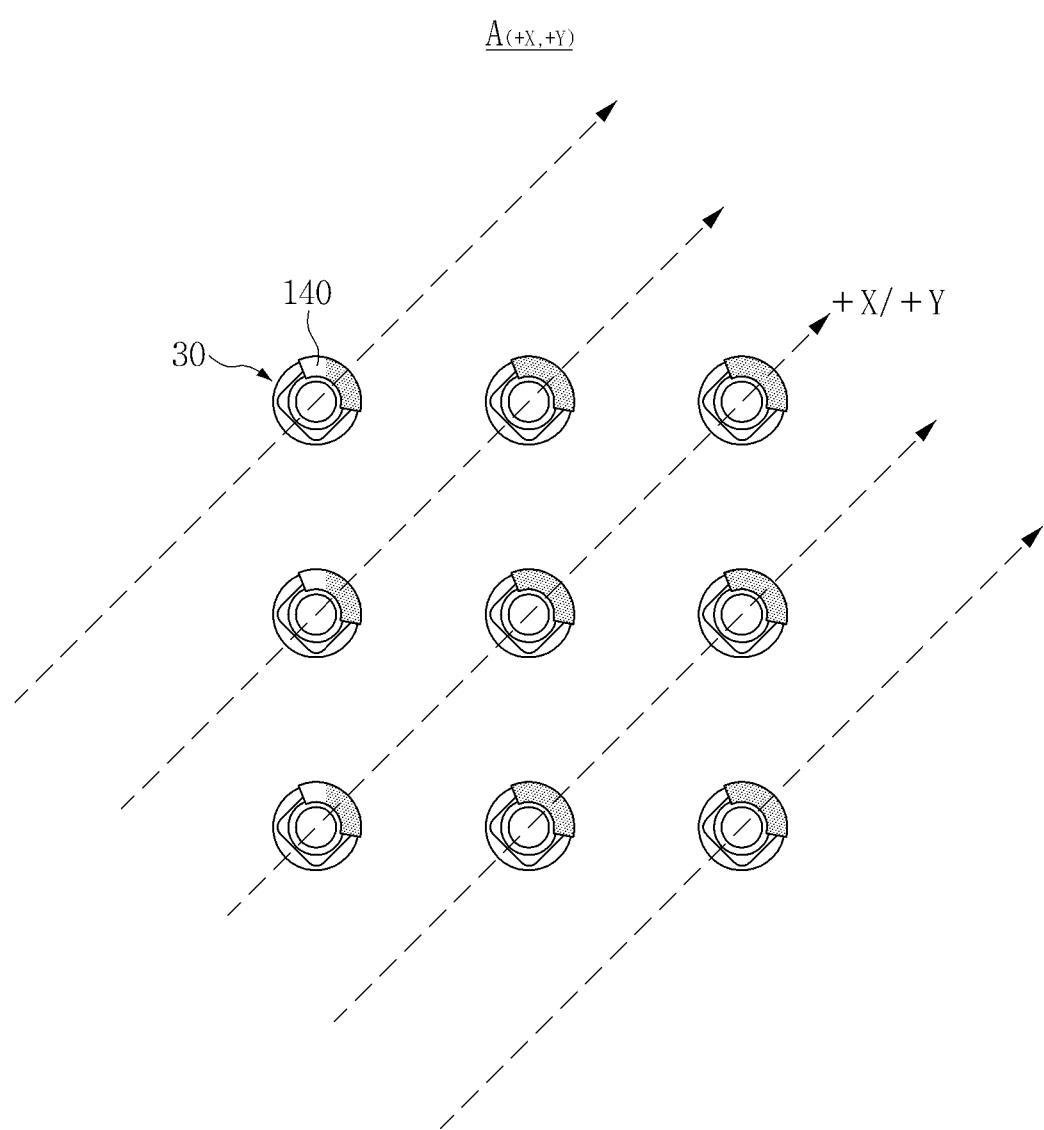

Referring to FIG. 4F, the bump pad structures 30 arranged in the area $A_{(+X,+Y)}$ in the +X/+Y direction may include the buffer patterns 140 located in the +X/+Y direction.

Figure 4G:
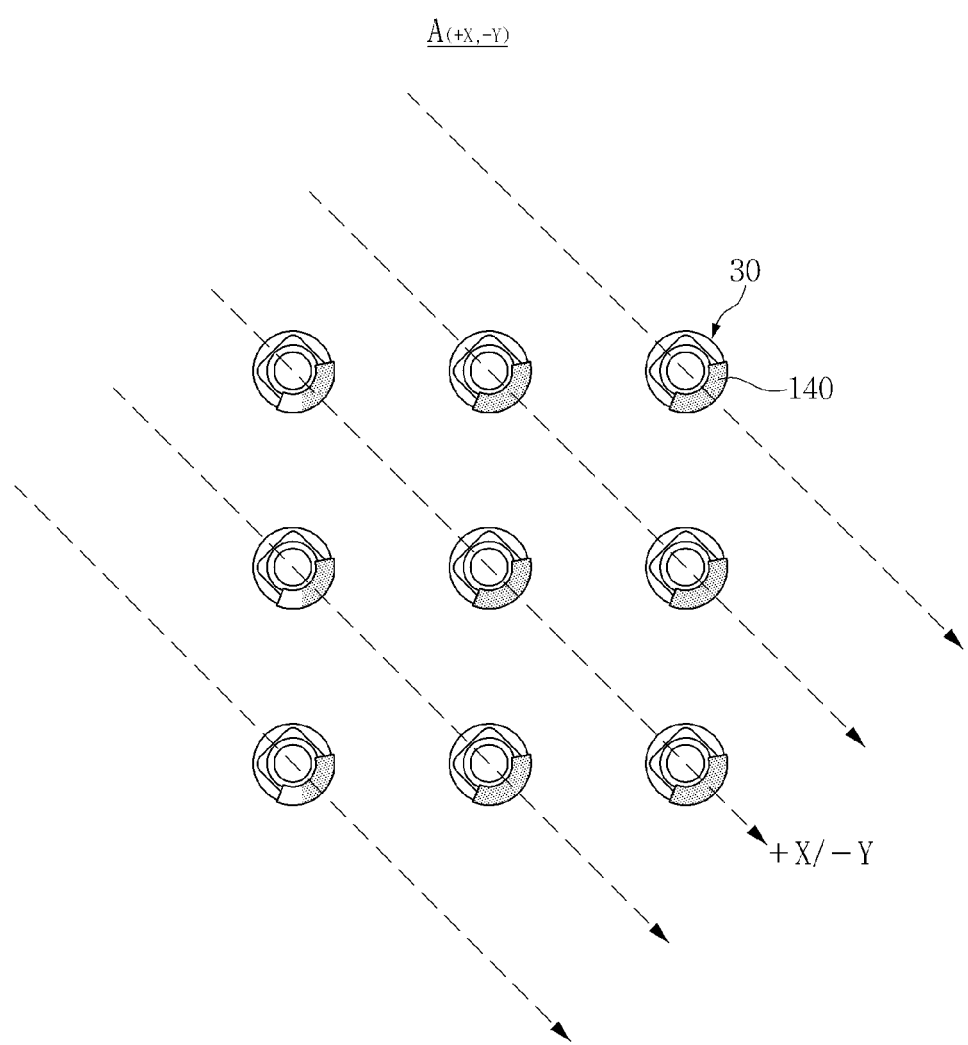

Referring to FIG. 4G, the bump pad structures 30 arranged in the area $A_{(+X,-Y)}$ in the +X/−Y direction may include the buffer patterns 140 located in the +X/−Y direction.

Figure 4H:
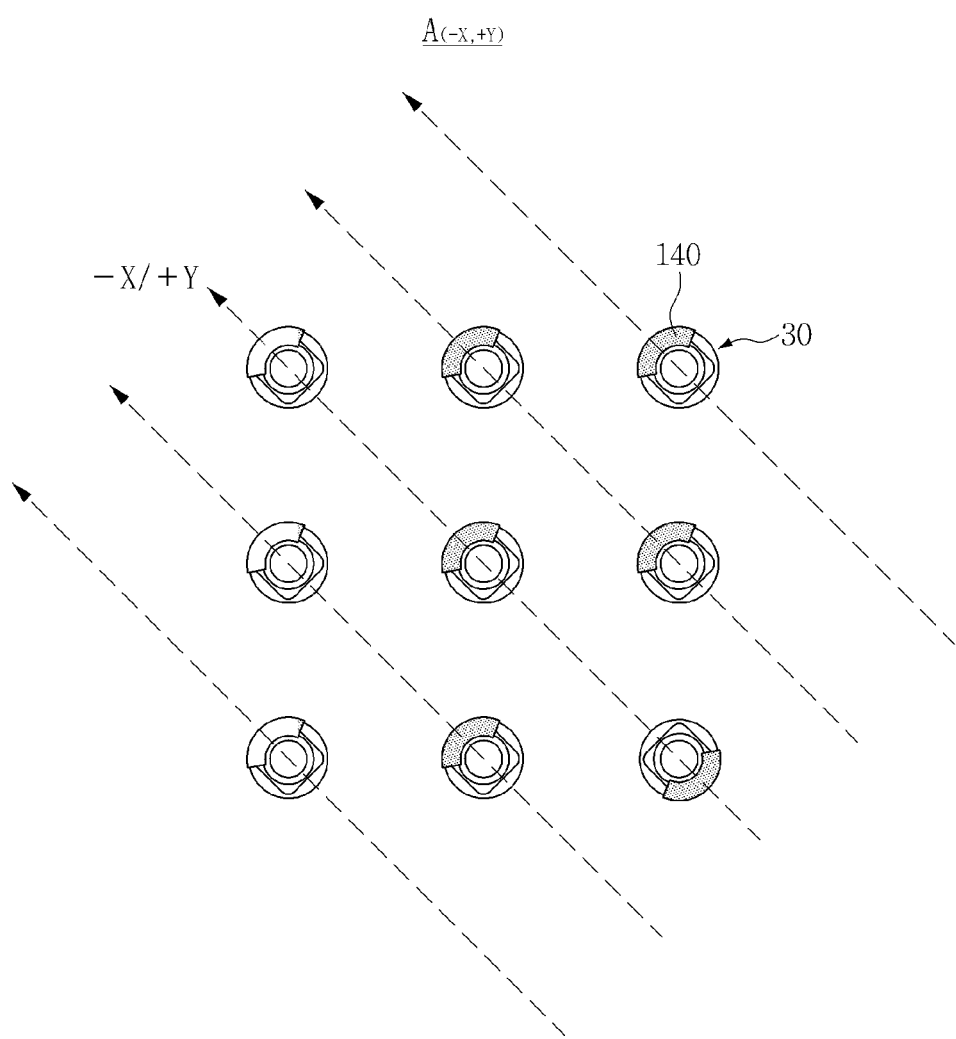

Referring to FIG. 4H, the bump pad structures 30 arranged in the area $A_{(-X,+Y)}$ in the −X/+Y direction may include the buffer patterns 140 located in the −X/+Y direction.

Figure 4I:
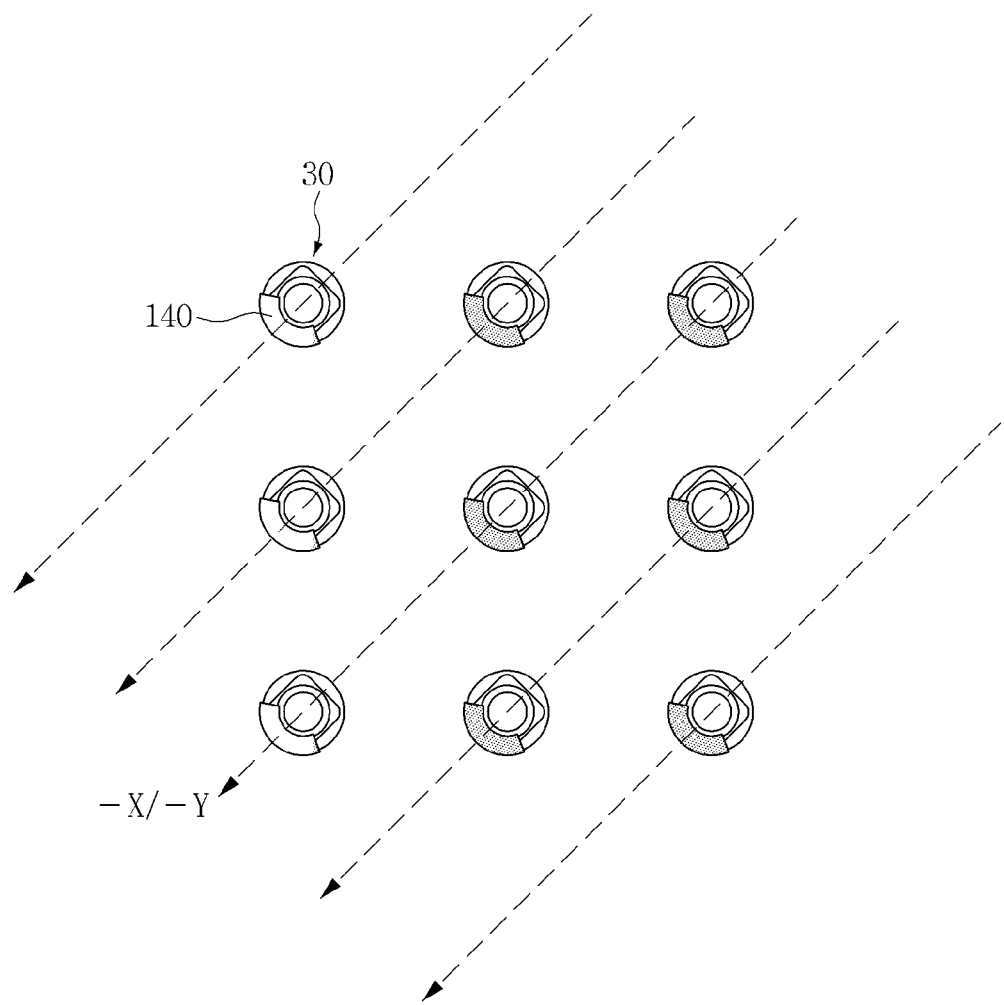

Referring to FIG. 4I, the bump pad structures 30 arranged in the area $A_{(-X,-Y)}$ in the −X/−Y direction may include the buffer patterns 140 located in the −X/−Y direction.

In this embodiment, the area $A_{(+X)}$ in the +X direction is defined as a +X-axis area, the area $A_{(-X)}$ in the −X direction is defined as a −X-axis area, the area $A_{(+Y)}$ in the +Y direction is defined as a +Y-axis area, the area $A_{(-Y)}$ in the −Y direction is defined as a −Y-axis area, the area $A_{(+X,+Y)}$ in the +X/+Y direction is defined as a first quadrant, the area $A_{(-X,+Y)}$ in the −X/+Y direction is defined as a second quadrant, the area $A_{(-X,-Y)}$ in the −X/−Y direction is defined as a third quadrant, and the area $A_{(+X,-Y)}$ in the +X/−Y direction is defined as a fourth quadrant.

Figure 5:
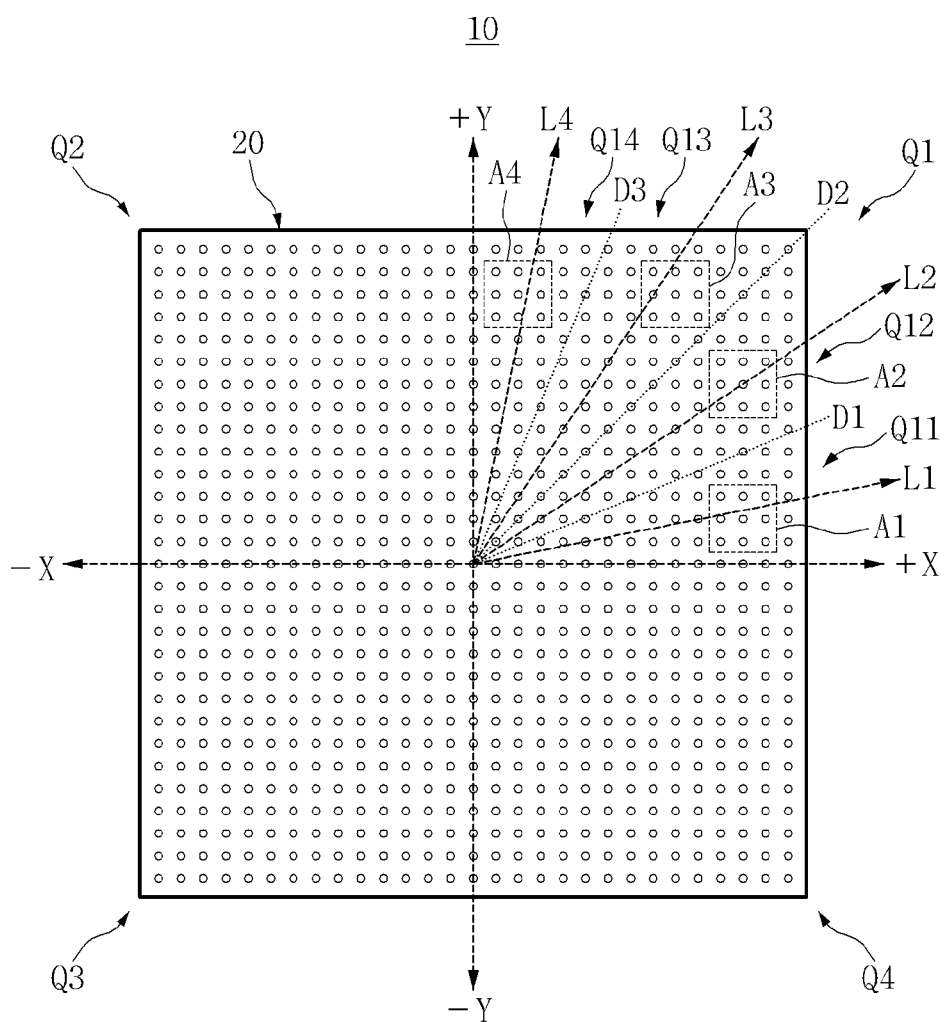
FIG. 5 shows an active surface having an arrangement of bump pad structures of a semiconductor device in accordance with an embodiment of the inventive concepts.

FIG. 5 shows an active surface 20 having an arrangement of bump pad structures 30 of a semiconductor device 10 in accordance with an embodiment of the inventive concepts, and FIGS. 6A to 6D are enlarged views showing some areas A1, A2, A3, and A4 of the bump pad structures 30 respectively arranged in sub-regions Q11, Q12, Q13, and Q14 in the first quadrant Q1 of FIG. 5.

Referring to FIG. 5, a semiconductor device 10 in accordance with an embodiment of the inventive concepts may include a plurality of bump pad structures 30 arranged in the shape of islands in a grid on the active surface 20. The active surface 20 may be divided into four quadrants Q1, Q2, Q3, and Q4. For example, the active surface 20 may be mathematically divided into a first quadrant Q1, a second quadrant Q2, a third quadrant Q3, and a fourth quadrant Q4. For easier understanding of the inventive concepts, only the first quadrant Q1 is enlarged and described. Accordingly, the inventive concepts of the first quadrant Q1 can be applied to all the other quadrants Q2, Q3, and Q4.

Referring again to FIG. 5, the first quadrant Q1 is virtually divided into a plurality of sub-regions Q11, Q12, Q13, and Q14. Boundaries of the sub-regions Q11, Q12, Q13, and Q14 are virtually illustrated using dotted lines. For example, the dotted lines D1, D2 and D3 form angles of 22.5°, 45°, and 67.5°, respectively, with an X-axis, which is a virtual horizontal line vertically bisecting the active surface 20. Division lines L1, L2, L3, and L4 which respectively bisect the sub-regions Q11, Q12, Q13, and Q14 are illustrated together using arrows. The division lines L1, L2, L3, and L4 may respectively form angles of 11.25°, 33.75°, 56.25°, and 78.75° with the horizontal line, that is, the X-axis.

Figure 6A:
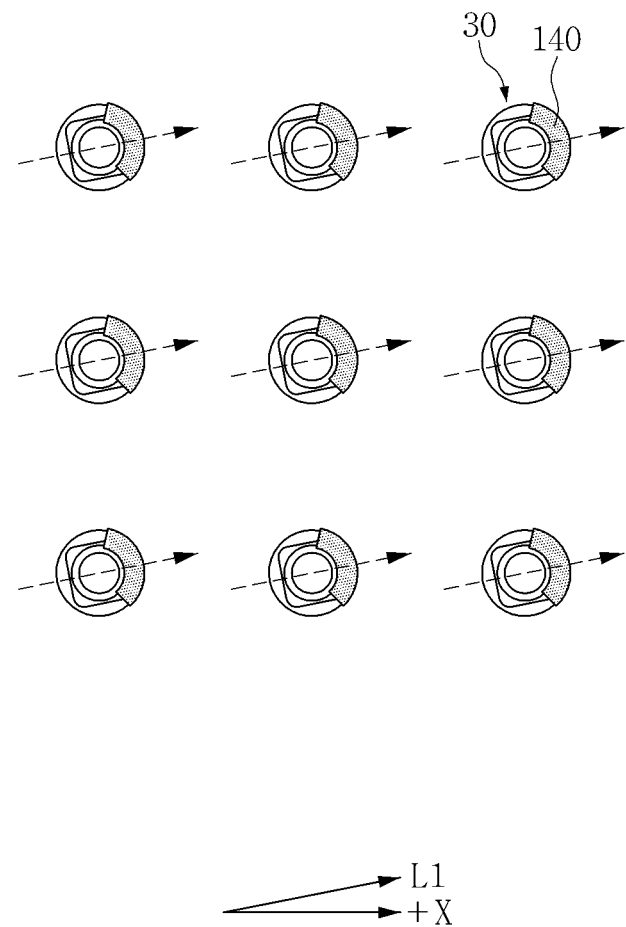
FIGS. 6A to 6D are enlarged views of some areas having the bump pad structures arranged in each sub-region in a first quadrant of FIG. 5.

Referring to FIG. 6A, the bump pad structures 30 arranged in the first sub-area Q11 may include buffer patterns 140 located outwardly along virtual center axes parallel to a first division line L1 which bisects the first sub-area Q11. For example, the first division line L1 may form an angle of about 11.25° with the X-axis, which is the virtual horizontal line vertically bisecting the active surface 20.

Figure 6B:
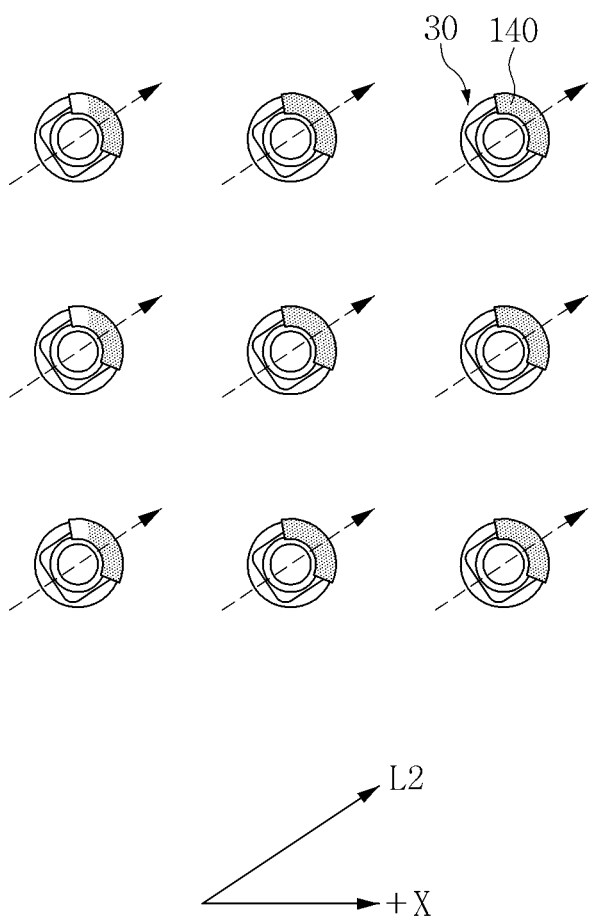

Referring to FIG. 6B, the bump pad structures 30 arranged in the second sub-area Q12 may include buffer patterns 140 located outwardly along virtual center axes parallel to a second division line L2 which bisects the second sub-area Q12.

For example, the second division line L2 may form an angle of about 33.75° with the X-axis, which is the virtual horizontal line vertically bisecting the active surface 20.

Figure 6C:
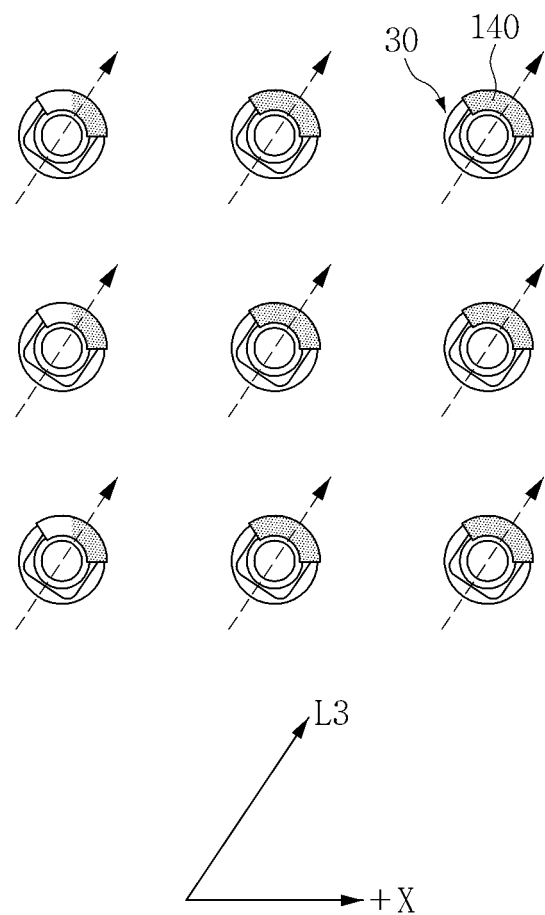

Referring to FIG. 6C, the bump pad structures 30 arranged in the third sub-area Q13 may include buffer patterns 140 located outwardly along virtual center axes parallel to a third division line L3 which bisects the third sub-area Q13. For example, the third division line L3 may form an angle of about 56.25° with the X-axis, which is the virtual horizontal line vertically bisecting the active surface 20.

Figure 6D:
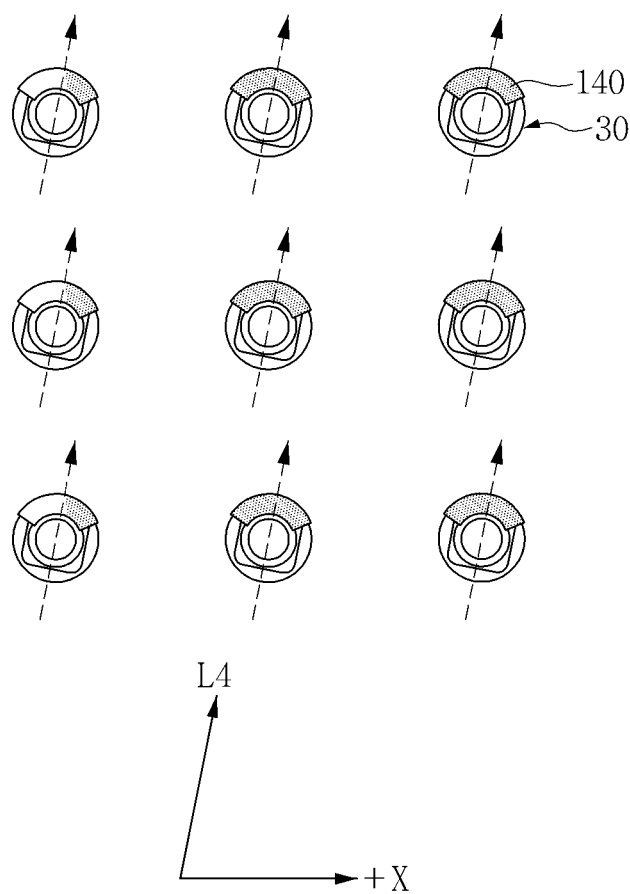

Referring to FIG. 6D, the bump pad structures 30 arranged in the fourth sub-area Q14 may include buffer patterns 140 located outwardly along virtual center axes parallel to a fourth division line L4 which bisects the fourth sub-area Q14. For example, the fourth division line L4 may form an angle of about 78.75° with the X-axis, which is the virtual horizontal line vertically bisecting the active surface 20.

In this embodiment, the bump pad structure 30 or the bump pad structures 30 arranged in the center or near the center of the active surface 20 may not have the buffer pattern 140.

In this embodiment, the areas Q11, Q12, Q13, and Q14 may be axis-symmetrically arranged with respect to the X-axis or the Y-axis, or point-symmetrically arranged with respect to the center of the active surface 20.

FIGS. 7A to 7I are cross-sectional views showing a method of forming a bump pad structure or a bump structure in accordance with an embodiment of the inventive concepts.

Figure 7A:
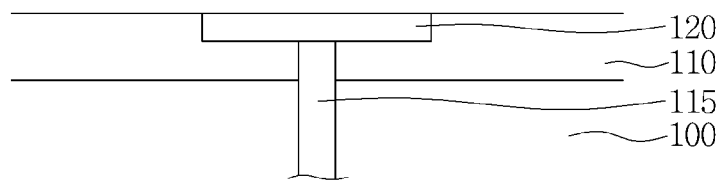
FIGS. 7A to 7I are cross-sectional views describing a method of forming a bump pad structure or a bump structure in accordance with an embodiment of the inventive concepts.

Referring to FIG. 7A, the method may include forming an upper layer 110 on a lower layer 100, forming a via plug 115 passing through the lower layer 100 and the upper layer 110, and forming a metal interconnection 120 on the via plug 115.

The lower layer 100 may include silicon or silicon oxide. For example, the lower layer 100 may include a silicon substrate, a lower inter-layer dielectric layer, and/or a lower inter-metal dielectric layer.

The upper layer 110 may be formed using a chemical vapor deposition (CVD) process, an atomic layered deposition (ALD) process, or a spin coating process. The upper layer 110 may include silicon oxide, silicon nitride, or a combination thereof. The upper layer 110 may include a plurality of insulating layers. For example, the upper layer 110 may include a silicon nitride layer directly formed on the lower layer 100, and a silicon oxide layer formed on the silicon nitride layer. Otherwise, the upper layer 110 may include two or more silicon oxide layers.

The via plug 115 may include a conductive material. For example, the via plug 115 may include a metal such as copper (Cu). The via plug 115 may be electrically connected to a semiconductor circuit or I/O elements disposed in or under the lower layer 100. In other embodiments, the via plug 115 may include a through silicon via (TSV) fully passing through the lower layer 100. The via plug 115 may further include a conductive barrier layer including a metal, and an insulating liner layer including silicon oxide, formed on a side surface of the via plug 15.

The metal interconnection 120 may include a metal, such as copper (Cu), aluminum (Al), or tungsten (W). The metal interconnection 120 may be a part of the uppermost metal layer. The metal interconnection 120 may be a circular or polygonal shape in a top view. In other embodiments, the metal interconnection 120 may have the shape of a horizontally extending line. The metal interconnection 120 may be buried in the upper layer 110. A surface of the metal interconnection 120 may be coplanar with a surface of the upper layer 110.

Figure 7B:
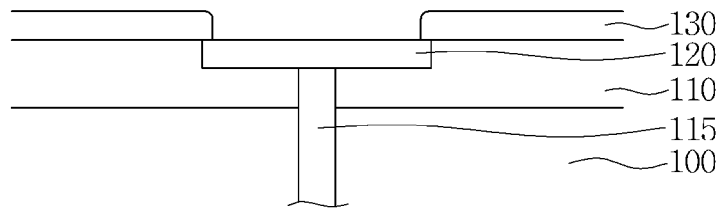

Referring to FIG. 7B, the method may include forming a passivation layer 130 which exposes a part of the metal interconnection 120. The passivation layer 130 may expose a center part of the metal interconnection 120 and cover an outer part of the metal interconnection 120. The passivation layer 130 may include silicon nitride.

Figure 7C:
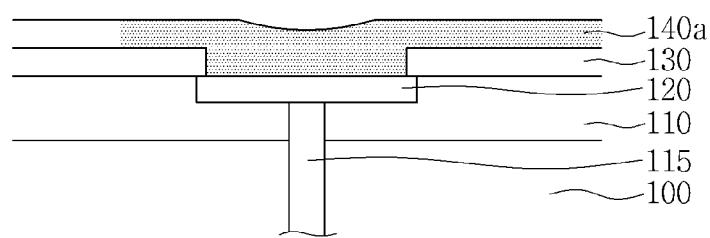

Referring to FIG. 7C, the method may include forming a buffer layer 140a covering the entire passivation layer 130 and the metal interconnection 120. The buffer layer 140a may be formed by performing a spin coating process. The buffer layer 140a may include a photo-sensitive polyimide.

Figure 7D:
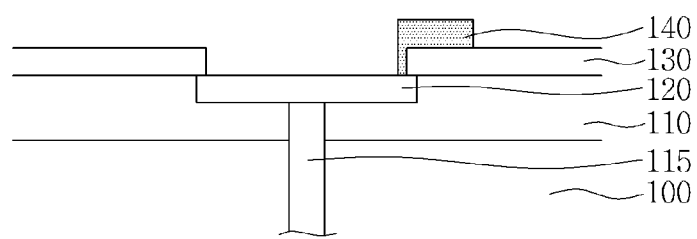

Referring to FIG. 7D, the method may include forming a buffer pattern 140 by patterning the buffer layer 140a. The patterning of the buffer layer 140a may include developing the buffer layer 140a using a photolithography process. The buffer pattern 140 may have a half-donut shape, a quarter-donut shape, or another appropriate shape between them, in a top view. If the buffer pattern 140 has a shape greater than the half-donut shape, it may be counterproductive to absorbing and dispersing of a stress.

The buffer pattern 140 may partly cover the outer part of the metal interconnection 120. In other embodiments, the buffer pattern 140 may expose edges of the passivation layer 130 adjacent to the metal interconnection 120 in order not to be in contact with the metal interconnection 120.

Figure 7E:
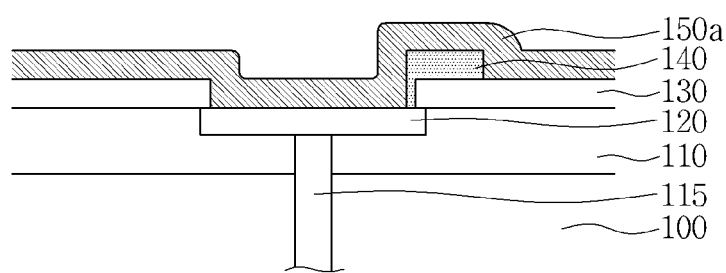

Referring to FIG. 7E, the method may include forming a wrapping layer 150a covering the entire passivation layer 130, an exposed surface of the metal interconnection 120, and the buffer pattern 140. The wrapping layer 150a may be formed using a spin coating process. The wrapping layer 150a may include a photo-sensitive polyimide.

Figure 7F:
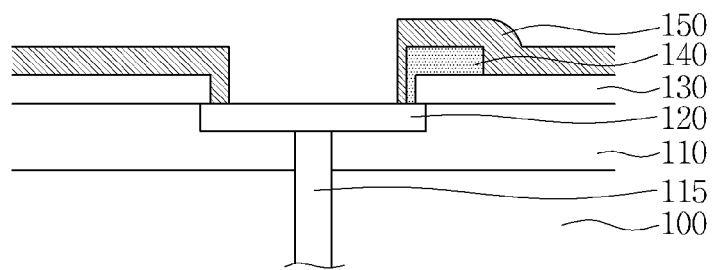

Referring to FIG. 7F, the method may include forming a wrapping pattern 150 by patterning the wrapping layer 150a. Patterning of the wrapping layer 150a may include developing the wrapping layer 150a using a photolithography process. The wrapping pattern 150 may expose the center part of the metal interconnection 120. The wrapping pattern 150 may partially cover the surface of the metal interconnection 120 adjacent to the passivation layer 130 and/or the buffer pattern 140. In other embodiments, the wrapping pattern 150 may expose an edge of the passivation layer 130 and an edge of the buffer layer 140a which are adjacent to the metal interconnection 120 in order not to be in contact with the metal interconnection 120.

Since the buffer pattern 140 is already formed before the wrapping pattern 150 is formed and the wrapping pattern 150 covers the buffer pattern 140, the buffer pattern 140 is not damaged during the process of forming the wrapping pattern 150.

In addition, since the wrapping pattern 150 has a smooth surface and covers the entire surface at the uppermost layer, a physical stress can be widely dispersed without being concentrated on a specific point, that is, a sharp edge, for example, an edge, a corner, or a vertex.

Figure 7G:
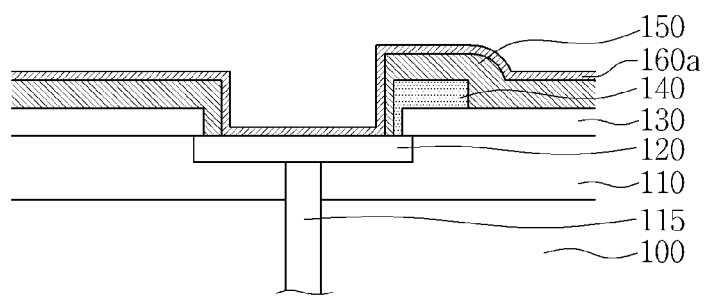

Referring to FIG. 7G, the method may include forming a pad layer 160a covering the exposed surface of the metal interconnection 120 on the wrapping pattern 150 using a physical vapor deposition (PVD) process, such as sputtering. The pad layer 160a may include a metal such as copper (Cu). In other embodiments, the pad layer 160a may include a lower pad layer and an upper pad layer. For example, the lower pad layer may include a barrier metal layer, such as titanium (Ti), titanium nitride (TiN), titanium tungsten (TiW), tantalum (Ta), tantalum nitride (TaN), or a combination thereof, or a seed metal layer, such as copper (Cu), nickel (Ni), or tungsten (W). The upper pad layer may include a seed metal layer, such as copper (Cu), nickel (Ni), or tungsten (W), or a capping metal layer, such as nickel (Ni) and silver (Ag).

Figure 7H:
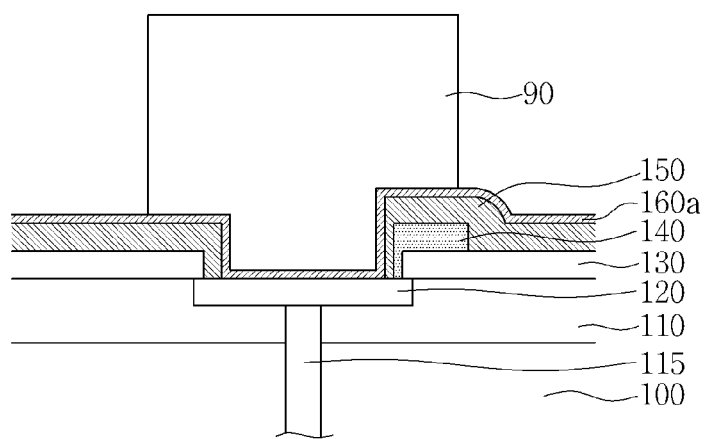

Referring to FIG. 7H, the method may include forming an etch mask 90 vertically aligned with the metal interconnection 120 on the pad layer 160a. The etch mask 90 may cover a part of the wrapping pattern 150 around the metal interconnection 120 and expose the other parts. The etch mask 90 may include a photoresist.

Figure 7I:
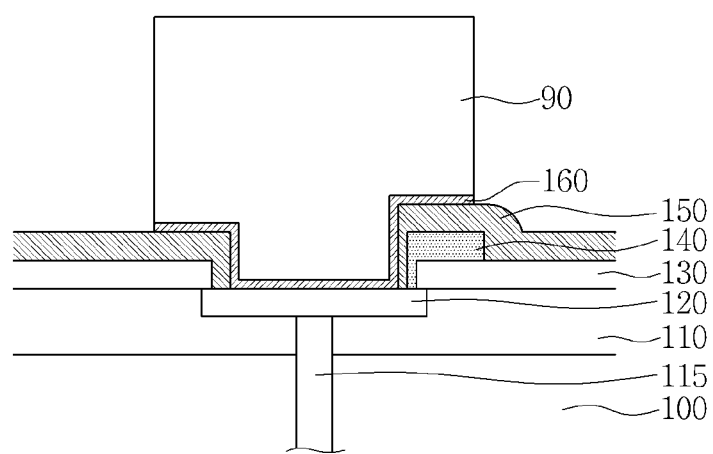

Referring to FIG. 7I, the method may include forming a pad pattern 160 by removing parts of the exposed pad layer 160 using the etch mask 90. The pad pattern 160 may be formed on the exposed part of the metal interconnection 120 and a part of the wrapping pattern 150 around the metal interconnection 120. The exposed pad layer 160a may be removed using a wet-etch process. For example, the exposed pad layer 160a may be removed using an etchant selectively including a hydrogen peroxide solution, citric acid, KOH, and water. When the pad layer 160a includes the upper pad layer and the lower pad layer, the pad layer 160a may be removed by performing two wet-etch processes. For example, when the upper pad layer includes a seed metal layer, the upper pad layer may be removed by performing a first wet-etch process using a chemical solution including a hydrogen peroxide solution, citric acid, and water. When the lower pad layer includes a barrier metal layer, the lower pad layer may be removed by performing a second wet-etch process using a chemical solution including a hydrogen peroxide solution, KOH, and water.

Next, referring FIG. 1B, the method may include removing the etch mask 90 to expose the pad pattern 160 formed on the center part of the metal interconnection 120. The removal of the etch mask 90 may include performing an ashing process using an oxygen plasma, or a sulfuric acid boiling process.

Referring again to FIG. 2A, the bump structure 40A may be formed by forming a solder ball 180 on the pad pattern 160.

Figure 8A:
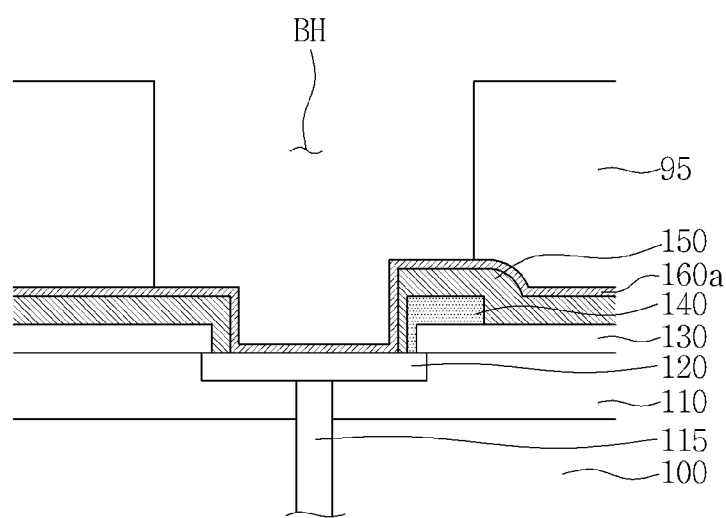
FIGS. 8A to 8C are cross-sectional views describing a method of forming a bump pad structure or a bump structure in accordance with an embodiment of the inventive concepts.
Figure 8B:
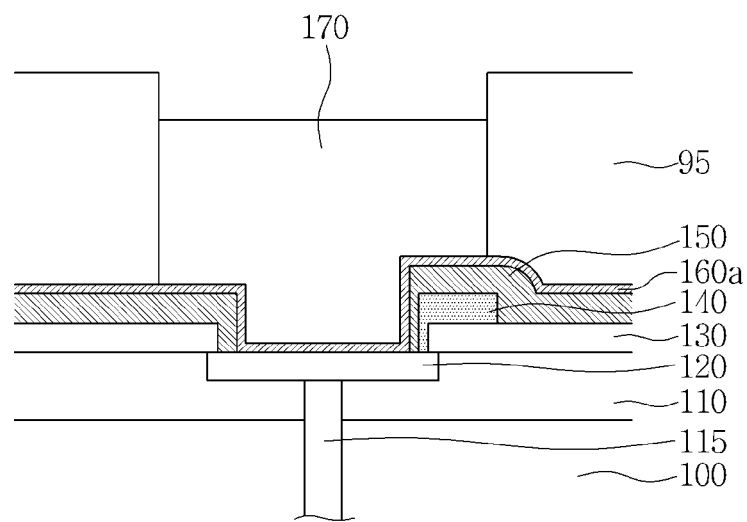
Figure 8C:
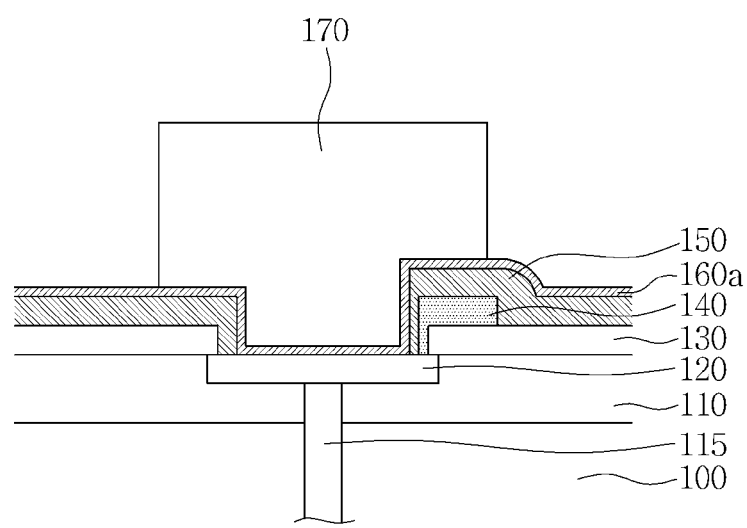

FIGS. 8A to 8C are cross-sectional views describing a method of forming a bump pad structure or a bump structure in accordance with an embodiment of the inventive concepts.

Referring to FIG. 8A, the method may include forming the pad layer 160a with reference to FIGS. 7A to 7G, and then forming a plating mask 95 having a bump hole BH vertically aligned with the metal interconnection 120. The bump hole BH may expose the pad layer 160a vertically aligned with the metal interconnection 120. In addition, the bump hole BH may overlap a part of the wrapping pattern 150 around the metal interconnection 120. The plating mask 95 may include a photoresist.

Referring to FIG. 8B, the method may include forming a metal pillar 170. The metal pillar 170 may be formed by performing an electroplating process using the pad layer 160a, more specifically the upper pad layer, as a seed layer. The metal pillar 170 may include copper (Cu) and/or nickel (Ni).

Referring to FIG. 8C, the method may include removing the plating mask 95 to expose the pad layer 160a on the wrapping pattern 150. The removal of the plating mask 95 may include performing an ashing process using oxygen plasma, or a sulfuric acid boiling process.

Next, Referring to FIG. 1C, the method may include removing the exposed pad layer 160a to form a pad pattern 160. The pad pattern 160 may be formed only under the metal pillar 170. The removal of the exposed pad layer 160a may be performed as described with reference to FIG. 7I.

Referring again to FIG. 2B, the bump structure 40B may be formed by forming a solder bump 185 on an upper surface of the metal pillar 170.

Figure 9A:
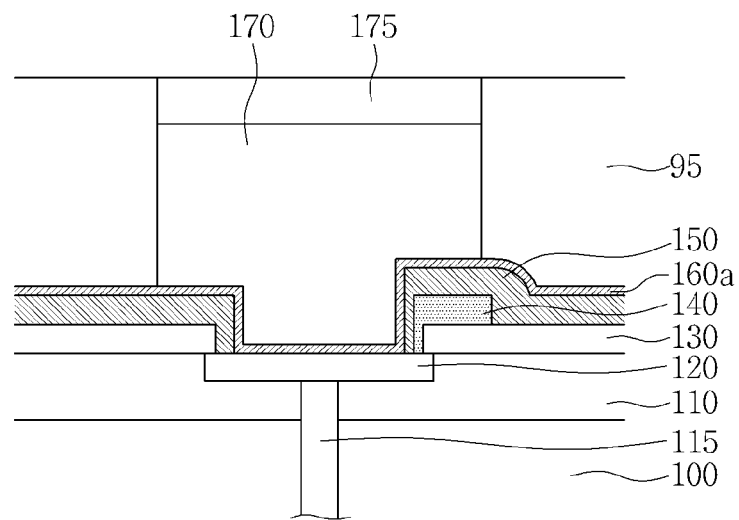
FIGS. 9A and 9B are cross-sectional views describing a method of forming a bump pad structure or a bump structure in accordance with an embodiment of the inventive concepts.
Figure 9B:
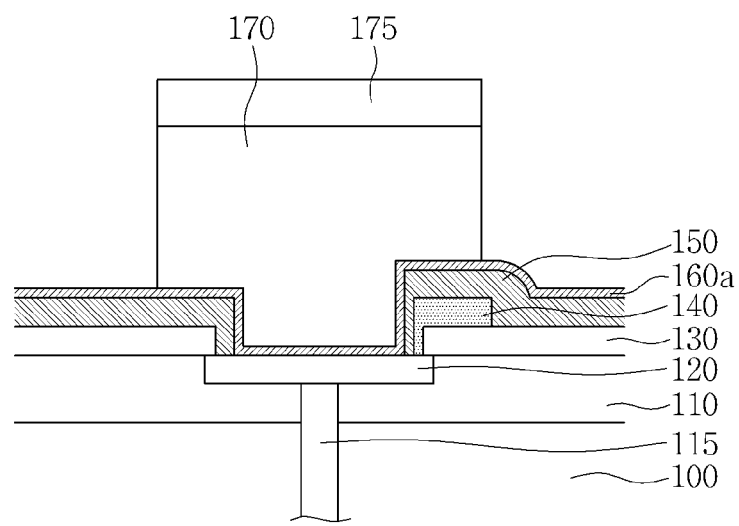

FIGS. 9A and 9B are views describing a method of forming a bump pad structure or a bump structure in accordance with an embodiment of the inventive concepts.

Referring to FIG. 9A, the method may include forming a metal pillar 170 by performing processes described with reference to FIGS. 7A to 7G and FIGS. 8A and 8B, and subsequently forming a capping metal layer 175 on the metal pillar 170. The capping metal layer 175 may be formed by performing an electroplating process. The capping metal layer 175 may include nickel (Ni) and/or silver (Ag).

Referring to FIG. 9B, the method may include removing the plating mask 95 to expose a part of the pad layer 160a.

Next, the method may include forming a pad pattern 160 by performing wet-etch processes described with reference to FIGS. 7I, 8C, and 8D.

Referring again to FIG. 2C, the bump structure 40C may be formed by forming a solder bump 185 on an upper surface of the capping metal layer 175.

Figure 10A:
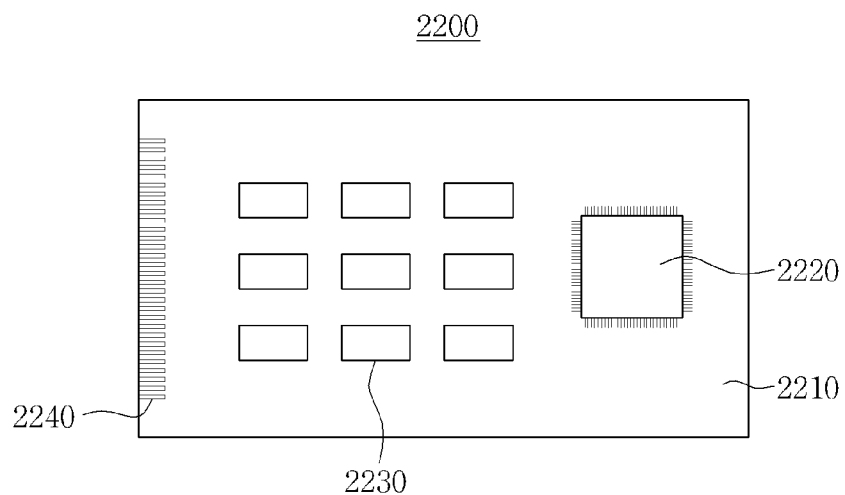
FIG. 10A is a diagram conceptually showing a semiconductor module in accordance with an embodiment of the inventive concepts.

FIG. 10A is a diagram conceptually showing a semiconductor module 2200 in accordance with an embodiment of the inventive concepts. Referring to FIG. 10A, the semiconductor module 2200 may include a processor 2220 and semiconductor devices 2230 formed on a module substrate 2210. The processor 2220 and the semiconductor devices 2230 may include at least one semiconductor device according to one or more of the various embodiments of the inventive concepts. Input/output terminals 2240 may be disposed at least at one side of the module substrate 2210.

Figure 10B:
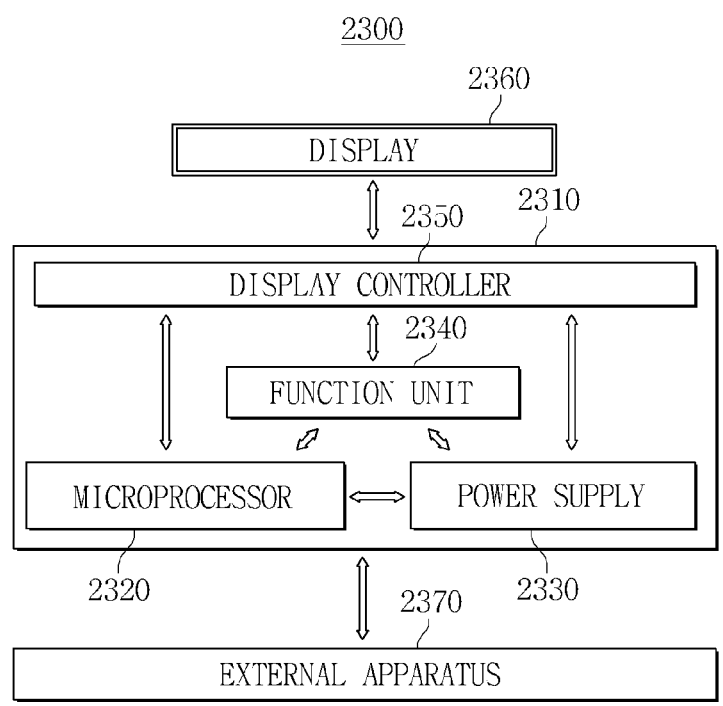
FIGS. 10B and 10C are block diagrams conceptually showing electronic systems in accordance with embodiments of the inventive concepts.
Figure 10C:
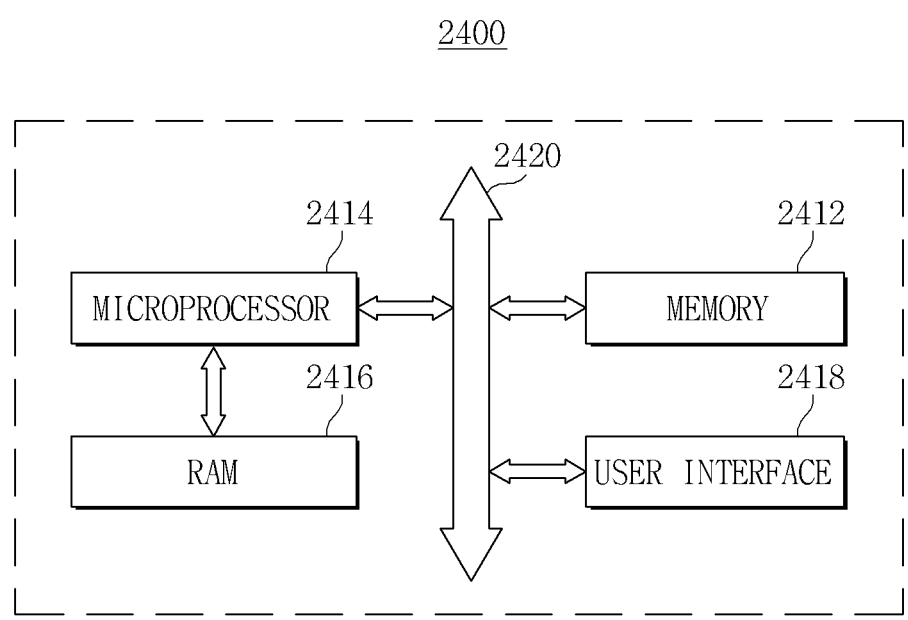

FIGS. 10B and 10C are block diagrams conceptually showing electronic systems in accordance with embodiments of the inventive concepts. Referring to FIG. 10B, an electronic system 2300 in accordance with an embodiment of the inventive concepts may include a body 2310, a display 2360, and an external apparatus 2370.

The body 2310 may include a microprocessor 2320, a power supply 2330, a function unit 2340, and/or a display controller 2350. The body 2310 may include a system board or motherboard having a printed circuit board (PCB), and/or a case. The microprocessor 2320, the power supply 2330, the function unit 2340, and the display controller 2350 may be installed or arranged on an upper surface or an inside of the body 2310. A display 2360 may be arranged on the upper surface or inside/outside of the body 2310.

The display 2360 may display an image processed by the display controller 2350. For example, the display 2360 may include a liquid crystal display (LCD), an active matrix organic light emitting diodes (AMOLED), or a variety of display panels. The display unit 2360 may include a touch-screen. Accordingly, the display 2360 may have an input/output function.

The power supply 2330 may supply a current or voltage to the microprocessor 2320, the function unit 2340, and the display controller 2350, etc. The power supply 2330 may include a rechargeable battery, a socket for the battery, or a voltage/current converter.

The microprocessor 2320 may receive a voltage from the power supply 2330 to control the function unit 2340 and the display 2360. For example, the microprocessor 2320 may include a CPU or an application processor (AP).

The function unit 2340 may perform various functions of the electronic system 2300. For example, the function unit 2340 may include a touch-pad, a touch-screen, a volatile/nonvolatile memory, a memory card controller, a camera, a light, an audio and video playback processor, a wireless transmit/receive antenna, a speaker, a microphone, a USB port, and other units having various functions.

The microprocessor 2320 or the function unit 2340 may include at least one of semiconductor devices in accordance with one or more of the various embodiments of the inventive concepts.

Referring to FIG. 10C, an electronic system 2400 in accordance with an embodiment of the inventive concepts may include a microprocessor 2414, a memory system 2412, and a user interface 2418 that communicate using a bus 2420. The microprocessor 2414 may include a CPU or an AP. The electronic system 2400 may further include a random access memory (RAM) 2416, which directly communicates with the microprocessor 2414. The microprocessor 2414 and/or the RAM 2416 can be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory system 2412 may store codes for operating the microprocessor 2414, data processed by the microprocessor 2414, or external input data. The memory system 2412 may include a memory controller, a hard disk, or a solid state drive (SSD). The microprocessor 2414, the RAM 2416, and/or the memory system 2412 may include at least one semiconductor device in accordance with one or more of the various embodiments of the inventive concepts.

In bump pad structures and bump structures of semiconductor devices in accordance with various embodiments of the inventive concepts, a physical stress applied to a metal interconnection, a passivation layer, a wrapping pattern, and/or a pad pattern can be asymmetrically absorbed, dispersed, and released. Accordingly, structural stability of the bump pad structures and bump structures of the semiconductor devices can be enhanced, and cracks, etc. can be released, reduced and/or prevented.

In bump pad structures and bump structures of semiconductor devices in accordance with various embodiments of the inventive concepts, since the uppermost wrapping pattern has a smooth surface, a stress applied to a bump pad structure can be released without being concentrated at a specific point.

In bump pad structures and bump structures of semiconductor devices in accordance with various embodiments of the inventive concepts, since a wrapping pattern is disposed on a buffer pattern, physical adhesion of the buffer pattern can be improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. A method of forming a bump pad structure, comprising:
forming an upper layer on a lower layer;
forming a metal interconnection on the upper layer;
forming a passivation layer exposing a center part of the metal interconnection on the upper layer;
forming a buffer pattern exposing the center part of the metal interconnection, and selectively and asymmetrically covering a peripheral region of the metal interconnection and a part of the passivation layer;
forming a wrapping pattern covering the buffer pattern and exposing the center part of the metal interconnection on the passivation layer; and
forming a pad pattern on the center part of the metal interconnection.

2. The method of claim 1, further comprising:
forming a via plug vertically passing through the lower layer and the upper layer, and vertically aligned with and in contact with the metal interconnection.

3. The method of claim 1, wherein a surface of the upper layer and a surface of the metal interconnection are coplanar.

4. The method of claim 1, wherein
the lower layer includes one of silicon and silicon oxide,
the upper layer includes silicon oxide, and
the passivation layer includes silicon nitride.

5. The method of claim 1, wherein the metal interconnection includes copper, and has a circular or polygonal shape in a top view.

6. The method of claim 1, wherein the buffer pattern and the wrapping pattern include polyimide.

7. The method of claim 6, wherein the buffer pattern covers a part of a sidewall of the passivation layer on the metal interconnection.

8. The method of claim 7, wherein the wrapping pattern covers a remaining part of the sidewall of the passivation layer and a sidewall of the buffer pattern.

9. The method of claim 1, wherein the buffer pattern has a half-donut shape, a quarter-donut shape, or a shape between a quarter-donut and half-donut shape in a top view to overlap a part of the metal interconnection.

10. The method of claim 9, wherein an outermost end of the buffer pattern is further away from the center of the metal interconnection than an outermost end of the metal interconnection.

11. The method of claim 1, wherein the pad pattern includes a lower pad pattern including a barrier metal, and an upper pad pattern including copper.

12. The method of claim 11, wherein the pad pattern includes a redistribution interconnection layer horizontally extending on the wrapping layer.

13. The method of claim 1, further comprising:
forming a copper pillar on the pad pattern.

14. The method of claim 13, further comprising:
forming a capping metal layer including nickel or silver on a surface of the copper pillar.

15. A method of forming a bump pad structure, comprising:
forming an upper layer on a lower layer;
forming a metal interconnection buried in the upper layer;
forming a passivation layer exposing a center part of the metal interconnection on the upper layer;
forming a buffer pattern vertically overlapping a part of the metal interconnection and a part of the passivation layer on the upper layer, the buffer pattern having a half-donut shape in a top view;
forming a wrapping pattern exposing the center part of the metal interconnection and covering the buffer pattern on the passivation layer; and
forming a pad pattern on the exposed center part of the metal interconnection and on a sidewall of the wrapping pattern adjacent to the exposed center part of the metal interconnection.

16. A method of forming a bump structure, comprising:
forming a passivation layer exposing a center part of a metal interconnection such that a first section of the passivation layer is formed on a peripheral portion of the metal interconnection;
forming a buffer pattern on the first section of the passivation layer and less than an entirety of the first section of the passivation layer such that the center part of the metal interconnection remains exposed;

forming a wrapping pattern on the buffer pattern and the passivation layer such that the center part of the metal interconnection remains exposed, wherein an upper surface of a portion of the wrapping pattern on the buffer pattern is higher than an upper surface of an adjacent portion of the wrapping pattern on the passivation layer; and forming a pad pattern on the center part of the metal interconnection.

17. The method of claim 16, wherein the forming a buffer pattern forms the buffer pattern such that at least a portion of the buffer pattern directly contacts the metal interconnection.

18. The method of claim 17, wherein the forming a wrapping pattern forms the wrapping pattern such that the wrapping pattern covers the buffer pattern and directly contacts a portion of the metal interconnection.

19. The method of claim 18, wherein the buffer pattern and the wrapping pattern include polyimide.

20. The method of claim 16, further comprising:
forming an upper layer on a lower layer; and
forming the metal interconnection on the upper layer.

* * * * *